(12) United States Patent
Nair

(10) Patent No.: US 8,378,513 B2
(45) Date of Patent: Feb. 19, 2013

(54) METHOD AND DEVICE FOR HARVESTING ENERGY FROM OCEAN WAVES

(75) Inventor: Balakrishnan Nair, Sandy, UT (US)

(73) Assignee: Oscilla Power Inc., Salt Lake City, UT (US)

( * ) Notice: Subject to any disclaimer, the term of this patent is extended or adjusted under 35 U.S.C. 154(b) by 0 days.

(21) Appl. No.: 13/105,759

(22) Filed: May 11, 2011

(65) Prior Publication Data

US 2012/0119494 A1 May 17, 2012

Related U.S. Application Data

(63) Continuation of application No. 12/906,895, filed on Oct. 18, 2010, now Pat. No. 7,964,977, which is a continuation of application No. 12/603,138, filed on Oct. 21, 2009, now Pat. No. 7,816,797.

(60) Provisional application No. 61/143,078, filed on Jan. 7, 2009.

(51) Int. Cl.
*F03B 13/10* (2006.01)
*F03B 13/12* (2006.01)
*H02P 9/04* (2006.01)

(52) U.S. Cl. ............................ 290/42; 290/53
(58) Field of Classification Search .............. 290/42, 290/53
See application file for complete search history.

(56) References Cited

U.S. PATENT DOCUMENTS

| 2,465,696 | A | * | 3/1949 | Paslay | 367/23 |
| 3,414,874 | A | * | 12/1968 | Mcload | 367/20 |
| 3,437,171 | A | * | 4/1969 | Davis et al. | 367/157 |
| 7,179,338 | B2 | | 2/2007 | Guruswamy et al. | 290/42 |
| 7,199,481 | B2 | | 4/2007 | Hirsch | 290/42 |
| 7,242,106 | B2 | | 7/2007 | Kelly | 290/42 |
| 7,298,054 | B2 | | 11/2007 | Hirsch | 290/42 |
| 7,385,301 | B2 | | 6/2008 | Hirsch | 290/42 |
| 7,454,978 | B2 | | 11/2008 | Schroeder et al. | 73/779 |
| 7,479,193 | B1 | | 1/2009 | Clark et al. | 148/108 |
| 7,564,152 | B1 | | 7/2009 | Clark et al. | 310/26 |
| 7,597,010 | B1 | | 10/2009 | Clark et al. | 73/862.335 |
| 7,735,373 | B2 | | 6/2010 | Cho et al. | 73/722 |
| 7,816,797 | B2 | | 10/2010 | Nair | 290/42 |
| 7,845,880 | B2 | | 12/2010 | Rasmussen | 405/76 |
| 7,878,734 | B2 | | 2/2011 | Bull et al. | 405/76 |
| 7,964,977 | B2 | * | 6/2011 | Nair | 290/42 |
| 2005/0099010 | A1 | | 5/2005 | Hirsch | 290/42 |
| 2007/0080539 | A1 | | 4/2007 | Kelly | 290/42 |
| 2007/0107528 | A1 | | 5/2007 | Schroeder et al. | 73/779 |
| 2007/0132246 | A1 | | 6/2007 | Hirsch | 290/42 |

(Continued)

FOREIGN PATENT DOCUMENTS

| WO | 2004/053175 | 6/2004 |
| WO | 2009/055710 | 4/2009 |

(Continued)

OTHER PUBLICATIONS

Berbyuk et al. "Towards Modelling and Design of Magnetostrictive Electric Generators" Computers & Structures, vol. 86, No. 3-5. (Feb. 2008), pp. 307-313.

(Continued)

*Primary Examiner* — Pedro J Cuevas
(74) *Attorney, Agent, or Firm* — Jeffrey T. Holman

(57) ABSTRACT

A method and device for generating electric power from ocean waves is described. The device includes at least one magnetostrictive element and at least one buoy. When the buoy is deployed in a body of liquid subject to wave motion, the buoy remains partially submerged during normal wave motion. The buoy is coupled to the magnetostrictive element to continuously exert a varying force on the magnetostrictive element during the normal wave motion.

20 Claims, 4 Drawing Sheets

U.S. PATENT DOCUMENTS

| | | | |
|---|---|---|---|
| 2007/0228737 A1 | 10/2007 | Hirsch | 290/42 |
| 2008/0168844 A1 | 7/2008 | Lequesne et al. | 73/779 |
| 2008/0277941 A1 | 11/2008 | Bowles et al. | 290/54 |
| 2009/0045042 A1 | 2/2009 | Browne et al. | 204/157.15 |
| 2009/0107247 A1 | 4/2009 | Schroeder et al. | 73/779 |
| 2009/0107248 A1 | 4/2009 | Schroeder et al. | 73/779 |
| 2009/0107249 A1 | 4/2009 | Schroeder et al. | 73/779 |
| 2009/0147619 A1 | 6/2009 | Welker | 367/15 |
| 2009/0255187 A1 | 10/2009 | Alexander et al. | 49/477.1 |
| 2009/0279391 A1 | 11/2009 | Cho et al. | 367/168 |
| 2010/0005896 A1 | 1/2010 | Miller et al. | 73/779 |
| 2010/0127698 A1 | 5/2010 | Shimada et al. | 324/209 |
| 2010/0133843 A1* | 6/2010 | Nair | 290/53 |
| 2010/0176693 A1 | 7/2010 | Pellegrini | 310/339 |
| 2010/0314871 A1 | 12/2010 | Jean et al. | 290/42 |
| 2011/0089697 A1* | 4/2011 | Nair | 290/53 |
| 2011/0133463 A1* | 6/2011 | Nair et al. | 290/53 |
| 2012/0001427 A1* | 1/2012 | Guruswamy et al. | 290/42 |
| 2012/0056432 A1* | 3/2012 | Nair et al. | 290/53 |
| 2012/0086205 A1* | 4/2012 | Nair et al. | 290/53 |

FOREIGN PATENT DOCUMENTS

| | | |
|---|---|---|
| WO | 2010/080885 | 7/2010 |

OTHER PUBLICATIONS

Zhao et al. "Application of the Villari Effect to Electric Power Harvesting" Journal of Applied Physics, vol. 99, Issue 8, (Apr. 2006), pp. 08M703-08M703-3.

"Population Trends Along the Coastal United State: 1980-2008" National Oceanic and Atmospheric Administration, (2003), available at: http://oceanservice.noaa.gov/programs/mb/pdfs/coastal_pop_trends_complete.pdf, last accessed May 2, 2011, 54 pages.

JHA "Making Waves: UK Firm Harnesses Power of the Sea . . . in Portugal" The Guardian, (Sep. 2008), available at http://www.guardian.co.uk/technology/2008/sep/25/greentech.alternativeenergy, last accessed May 2, 2011, 3 pages.

* cited by examiner

METHOD AND DEVICE FOR HARVESTING ENERGY FROM OCEAN WAVES

CROSS-REFERENCES TO RELATED APPLICATIONS

This application is a continuation of U.S. application Ser. No. 12/906,895, filed Oct. 18, 2010, entitled "Method and Device for Harvesting Energy from Ocean Waves," which is a continuation of U.S. application Ser. No. 12/603,138, filed Oct. 21, 2009, now issued as U.S. Pat. No. 7,816,797, which claims the benefit of U.S. Provisional Application No. 61/143,078, filed Jan. 7, 2009.

BACKGROUND

Embodiments of the invention described herein relate to a method and device for producing electricity by conversion of the mechanical energy of waves such as ocean waves in a water body.

Identification of new non-fossil fuel based energy sources that are both commercially viable and environmentally benign has become a vital technological need for the next century. Such technology will not only fuel economic growth and contribute to global environmental sustainability, but also reduce a nation's energy dependence on foreign oil in coming decades.

The world's oceans have long been thought of as sources of tremendous energy, with the global capacity estimated to be around 2 terra-Watts. Successful harvesting of energy from the ocean can help to relive the load at the point of demand on some of the most heavily populated regions of the United States. A survey conducted by the National Oceanic and Atmospheric Administration (NOAA) found that approximately 153 million people (53 percent of the nation's population) lived in the 673 U.S. coastal counties. Many nations around the world including the United Kingdom, Australia, China and India have densely populated coast-lines that can benefit substantially by harvesting power from ocean waves.

There are several methodologies of tapping energy from the oceans, and these methods can be broadly divided into thermal, tidal, and wave techniques. Of these various methods, the harvesting of wave energy is of particular importance. Within the area of wave energy harvesting, devices can again be sub-divided into on-shore and off-shore devices. Off-shore power devices tap the energy available from ocean waves using an oscillating water column type device. Efforts to tap the seemingly unlimited energy available through harvesting of ocean waves have proven to be difficult.

Large scale efforts to tap energy from the ocean continue to be hampered by high energy costs and low energy densities. It is estimated that the energy cost per kW from ocean energy with conventional technologies is around 20 cents/kWh, a level at which some form of subsidies are required for the technology to be widely adopted. In addition, hidden costs include the possibility of high replacement costs in the event of catastrophic failure or damage during major storms.

SUMMARY

Embodiments described herein include a method and device for converting the mechanical energy of oscillating ocean waves into magnetic and electrical energy using a novel design that utilizes magnetostrictive elements. Embodiments of the design combine proven concepts from existing technologies, such as the oscillating buoy concept used in the Pelamis machine with technology proven on the bench scale for energy generation using magnetostrictive devices to create a powerful solution for harvesting energy from ocean waves. Embodiments of the design are expected to have relatively low capital costs and very good survivability during strong storms. Numerical models to be developed are expected to outline specific designs of the device capable of delivering over 1 GW of power and perform bench scale demonstration of the key concept of generating electric power using a modular structure containing magnetostrictive elements. Some embodiments may include power management strategies to optimize the delivered power from a suite of these devices distributed across the ocean surface.

Embodiments of the invention relate to methods for generating electricity. In one embodiment, the method includes exposing a magnetostrictive element to a force due to wave motion of a body of liquid. The force, which could be a tensile force, results in a magnetic flux change in the magnetostrictive element. The method also includes using producing electric power through electromagnetic induction based on the magnetic flux change in the magnetostrictive element. Other embodiments of methods for generating electricity are also described.

Embodiments of the invention also relate to a device for generating electricity. In one embodiment, the device includes at least one magnetostrictive element and at least one buoy. When the buoy is deployed in a body of liquid subject to wave motion, the buoy remains partially submerged during normal wave motion. The buoy is coupled to the magnetostrictive element to continuously exert a force on the magnetostrictive element during the normal wave motion.

In another embodiment, the device includes a magnetostrictive element and an electromagnetic induction structure. The magnetostrictive element, when deployed in a body of liquid subject to wave motion, experiences a load change with an associated magnetic flux change in response to the wave motion. The electromagnetic induction structure produces electric power through electromagnetic induction in response to the magnetic flux change of the magnetostrictive element. Other embodiments of devices for generating electricity are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

FIG. 4 depicts a schematic circuit diagram of one embodiment of an equivalent circuit diagram of several magnetostrictive elements arranges so as to move synchronously as an ocean wavefront moves through.

DETAILED DESCRIPTION

Figure 1:
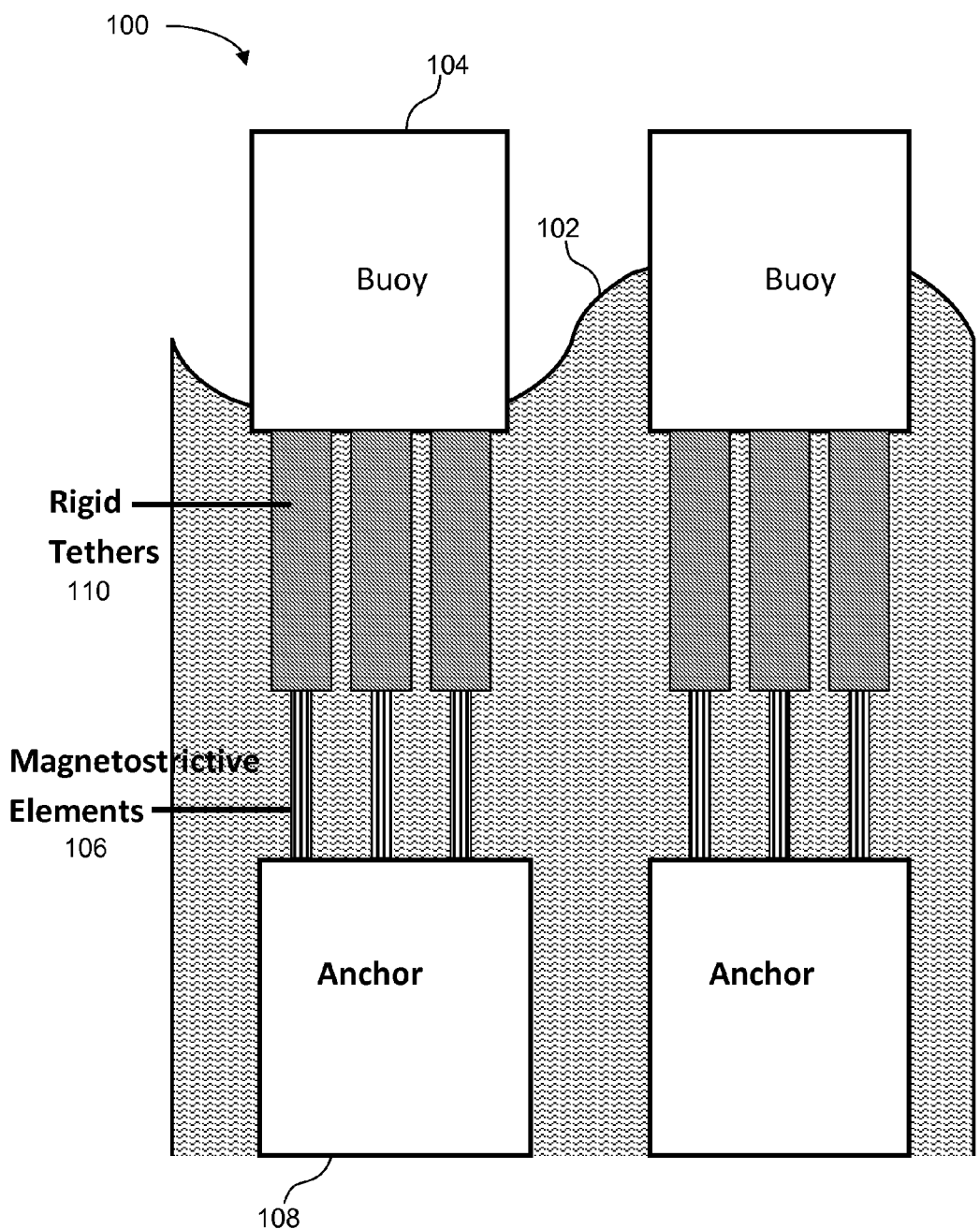
FIG. 1 depicts a schematic block diagram of one embodiment of a device for harvesting energy from the oscillations of ocean waves.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some embodiments of the invention include a method and device to capture the energy of oscillations in ocean waves and convert this energy into electrical energy. In this description, references to an "ocean wave" refer to waves in any stationary, moving, or oscillating body of water, and the use of the word ocean wave in no way limits the scope or applicability of the invention to the ocean environment alone.

FIG. 1 depicts a schematic block diagram of one embodiment of a device 100 for harvesting energy from the oscillations of ocean waves 102. The core modules includes a buoy 104 or buoys attached to one or more magnetostrictive elements 106, which in turn are anchored to the seafloor or to another fixed surface or body using heavy weights 108, or by any other method. Although the magnetostrictive elements are shown attached to the buoys by rigid tethers 110, other embodiments may use non-rigid tethers. Alternatively, the tethers may be omitted altogether, so that the magnetostrictive elements extend from the anchors to the buoys. The term buoy, in the context of this description refers to any physical body that may float on or near the surface of a body of water when allowed to freely do so with no forces other than its own gravity and the buoyant force applied by the water acting on the body.

Magnetostrictive materials have the property that when a strain is imposed on these materials, it results in a change in magnetization (or flux density) of an associated magnetic field. The phenomenon of magnetostriction has been known for over a century, but the field was really revolutionized by the discovery of giant magnetostrictive (Tb,Dy) alloys for use at cryogenic temperatures in the 1960s. Subsequently, giant magnetostrictive materials that work at room temperature including (Tb,Dy) and Terfenol alloys were developed. (Tb, Dy) and Terfenol-D alloys have saturation strain values as high as $10^{-2}$ (10,000 ppm) and $2\times10^{-3}$ (2000 ppm), respectively, allowing for the development of many practical applications including torque sensors and high precision actuators. Magnetostrictive materials show changes in linear dimensions when a magnetic field is applied (Joule magnetostriction) and a reciprocal effect of changes in the magnetic properties with the application of stress. These characteristics make it possible to use magnetostrictive materials to function as both actuators and as sensors. They are analogous to piezoelectric materials, but have a large operating bandwidth extending to low frequencies, higher energy density, and capability for higher power and force delivery. For certain embodiments of this particular application, magnetostrictive materials are superior to piezoelectric materials due to their greater mechanical durability and lower production cost in high volumes.

When a wave moves through a location, the geometry outlined here, and shown in FIG. 1, results in the line tension in the magnetostrictive elements being a strong function of the wave amplitude. While the actual geometry of ocean waves is complex and is a cumulative summation of a spectrum of wavelets that result in changes in the effective amplitude and frequency, for the purpose of the discussion here, waves are considered to be sinusoidal for simplicity. When the wave amplitude is such that it is close to a crest, more of the buoy is submerged in water resulting in a greater tensile load on the magnetostrictive element. As the wave is at a trough, less of the buoy is submerged resulting in a lower tensile load on the magnetostrictive element. The geometry of the individual magnetostrictive elements may be defined such that, for the appropriate type of buoy, the expected loads generated will result in strains that are below the saturation magnetostriction. Thus, as the wave oscillates, the extension of the magnetostrictive element follows a similar oscillation, resulting in a constantly changing magnetic flux density along the length of the magnetostrictive element. This constantly changing magnetic flux density is used to generate an induced voltage in a coil wound around the magnetostrictive element, schematically illustrated in FIG. 2, by Faraday's law of induction, which is represented by the following equation:

$$\epsilon = -n(d\phi/dt),$$

where n is the number of turns of the coil and the term $(d\phi/dt)$ is the time derivative of the magnetic flux, $\phi$.

Figure 2:
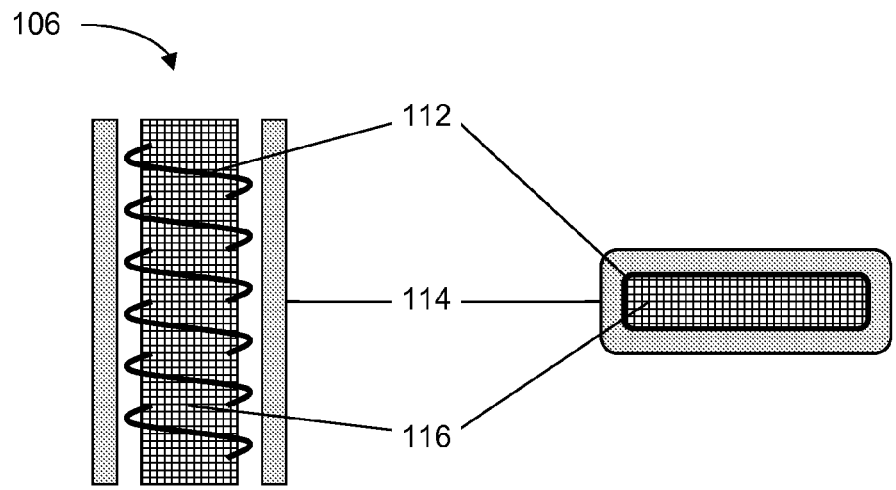
FIG. 2 depicts a schematic diagram of one embodiment of the magnetostrictive elements of the energy harvesting device of FIG. 1.

FIG. 2 depicts a schematic diagram of one embodiment of the magnetostrictive elements 106 of the energy harvesting device 100 of FIG. 1. In the depicted embodiment, the magnetostrictive element 106 includes a polymer coated copper coil 112, an external protective polymer sheath 114, and a magnetostrictive rod 116. The illustration of the magnetostrictive element and coil, shown in FIG. 2, in no way limits the type, orientation, structure, composition, of either the magnetostrictive element of the coil. The coil may, without limitation, be wound, suspended, printed or otherwise attached or located in the vicinity of the magnetostrictive element. The term magnetostrictive element simply refers to a buoy or structure, at least a portion of which is constructed of materials possessing magnetostrictive properties. For reference, the "vicinity" of the magnetostrictive element refers to any location adjacent to or within the proximity of the magnetostrictive element which allows the coil to sufficiently experience the changing magnetic flux density of the magnetostrictive element so as to result in a measurable potential or current, for example, greater than about 0.01 mV or about 0.01 μA, respectively. More specifically, the vicinity may be limited to distances at which the coil experiences a measurable change in the magnetic flux density of the magnetostrictive element. Since the strength and profile of the changing magnetic flux density may depend on the configuration of the magnetostrictive element, and the sensitivity of the coil may depend on the construction and placement of the coil, the "vicinity" of the magnetostrictive element may vary from one embodiment to another.

While the buoy may be of any shape and size, in at least one embodiment the buoys are designed such that their vertical height, or other dimension at normal to the surface of the ocean, exceeds the expected amplitude of oscillations of normal wave motion at a geographic location of interest. In other words, in some embodiments, the buoy is always partially submerged whether it is at the crest of a wave or the trough. In some embodiments, the system is also designed such that even as the wave is at a trough, the submerged portion of the buoy is more than what it might have been if the buoy were floating freely—this ensures a tensile load on the magnetostrictive elements through the entire range of motion of the buoy as the wave oscillates, and that the field changes constantly as the wave progresses through its entire amplitude. If at any point the strain reaches a maximum (for example, the buoy is fully submerged), for some period of time following that, until the strain starts to change again, the output voltage will be zero or near zero.

The fact that the generated voltage is proportional to the differential of the magnetic flux, according to the equation presented above, provides the explanation for two statements mentioned below.

1. The maximum strain in the magnetostrictive elements should not exceed the strain needed for the saturation magnetization along the length of the element. If the saturation strain is exceeded, then there is no further change in the magnetic flux density for the period of time until the strain relaxes again and falls below the saturation level. During this period where the saturation strain is exceeded, the magnetic flux is constant resulting in a zero EMF output.
2. The buoy may be designed such that the buoy is always submerged more than its "equilibrium" state—i.e., the level to which the buoy would have submerged if it were free-floating. This ensures a constantly changing, but always tensile load on the magnetostrictive elements. If this load were relaxed, the strain plateaus to zero again resulting in a zero flux differential and zero EMF.

The structure of the magnetostrictive elements is shown in more detail in FIG. 2. A core-rod of magnetostrictive material is wound with polymer (e.g., Teflon, PTFE) coated copper wire to the desired number of turns. The selection of the polymer is not critical except that the polymer should be rated to provide electrical insulation for the highest rated voltage expected in the coil. The wire diameter may be optimized for the intended application, as there is a trade-off between using an increased wire diameter to lower electrical resistance of the coil that allows the delivery or a greater voltage and higher power (lower IR losses) and using a decreased wire diameter to lower the cost and weight of the coil itself. The external sheath can also be of the same or similar material as the polymer coating. Alternatively, the external sheath may be another material to provide corrosion protection of the magnetostrictive rod.

Based on the design outlined above, some embodiments may account for specific variations in sea level due to factors such as tides for ensuring that the structure continues to function as an effective power generation source while the external environment varies. Hence, the location of the buoy relative to the nominal surface of the ocean is a consideration for the device to function effectively. Thus, seasonal and daily tidal variations may be accounted for in the determination of where to locate the buoys.

Figure 5:
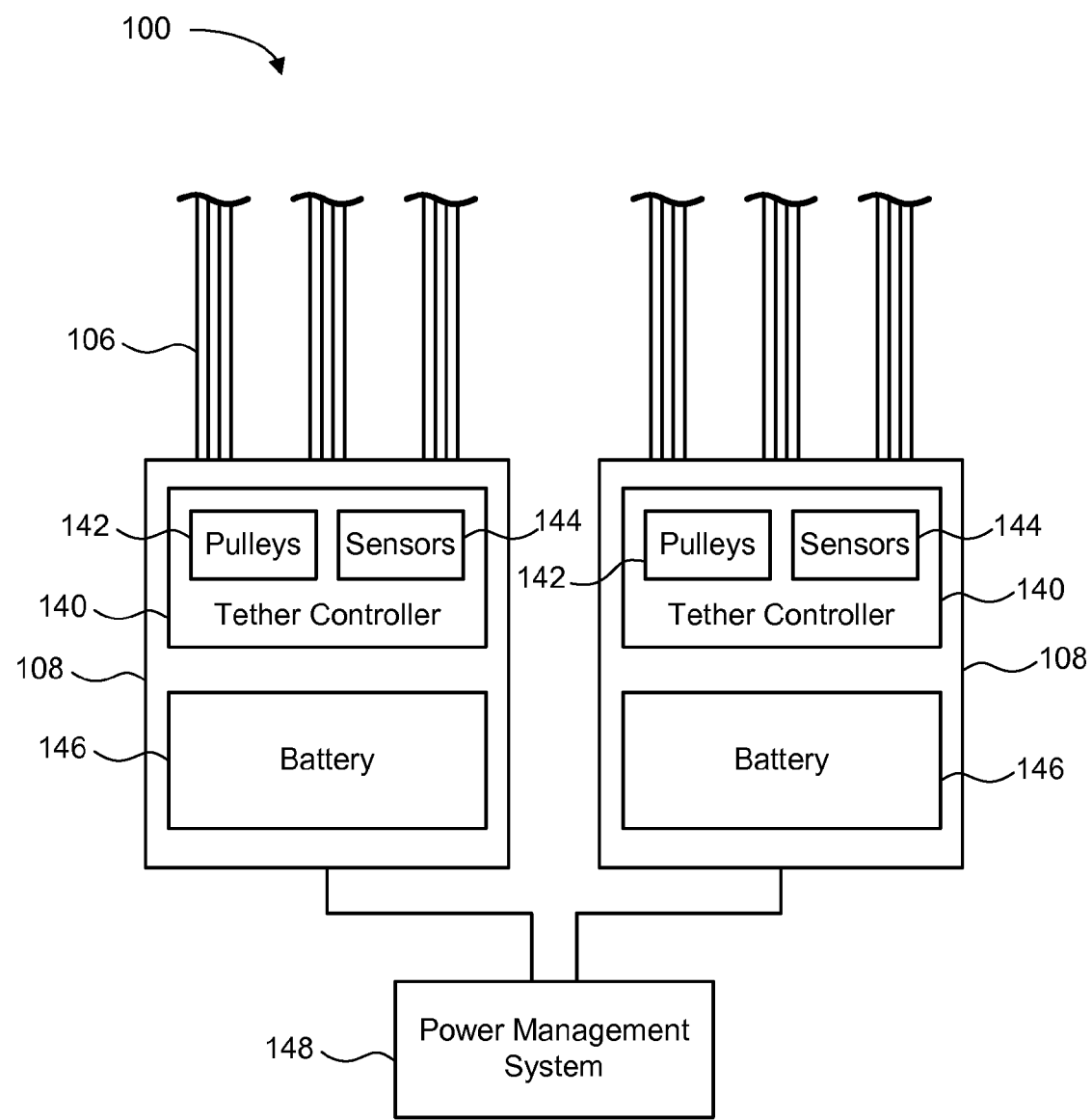
FIG. 5 depicts another schematic block diagram of the energy harvesting device of FIG. 1.

Additionally, some embodiments include a system to monitor and control the mean tension in the magnetostrictive elements. FIG. 5 shows one example of a tether controller 140 to provide such monitoring and control. In one example, in high tide more of the tethers are released, and in low tide the excess length is reeled in to effectively shorten the length. Thus the "anchor" rather than being a dead-weight may have a pulley system 142 (refer to FIG. 5) and load sensors 144 (refer to FIG. 5) to release or reel in the magnetostrictive elements as needed. In one embodiment, the energy for the tension control system may be supplied by the corresponding magnetostrictive elements and coils. Such energy may be supplied on demand or via a storage device such as a battery 146 (refer to FIG. 5).

Referring again to the construction of the magnetostrictive elements, other embodiments may use other materials. Recent research explored ductile and low field magnetostrictive alloys based on Fe—Ga, Fe—Mo, and Fe—W. In some embodiments, these alloys are attractive due to their excellent ductility and high magnetostriction values obtained at low applied magnetic fields that are an order of magnitude smaller than that needed for Terfenol-D alloys For this application, however, the saturation magnetization is not critical as any magnetostrictive material can be made to work by changing the geometry of the magnetostrictive element for the appropriate expected loading. What may be more critical are factors such as cost and reliability as these factors directly affect the capital and operating costs of energy harvesting device and, therefore, the cost of the delivered energy. The reliability requirement may be divided into a mechanical strength requirement and a corrosion resistance requirement; although the latter may be less critical if appropriate protective jackets, or sheaths, are used. As a simple comparison of Terfenol-D with alpha-iron-based alloys (Fe—Ga, Fe—Al, Fe—W and Fe—Mo), Terfenol-D is an alloy or iron with terbium and Dysprosium ($Tb_{0.3}Dy_{0.7}Fe_{1.9}$). The high alloying levels of the relatively scarce and expensive Tb and Dy makes Terfenol-D very expensive. On the other hand, α-Fe based alloys are relatively inexpensive and robust, and α-Fe based alloys provide adequate magnetostrictive behavior for this application, in certain embodiments.

Figure 3:
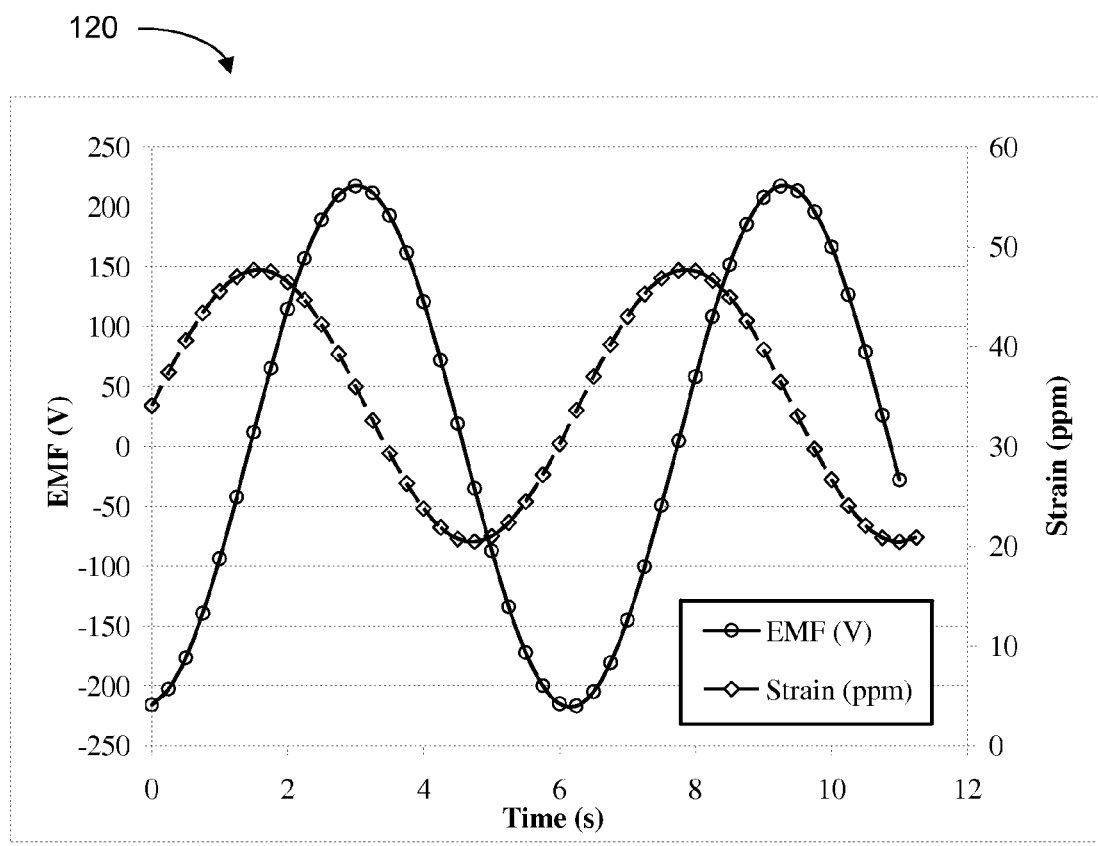
FIG. 3 depicts a graph of calculation results of initial analysis of power generation from ocean waves using one embodiment of a magnetostrictive element subjected to a cycling load employing a partially submerged buoy.

FIG. 3 depicts a graph 120 of calculation results of initial analysis of power generation from ocean waves using one embodiment of a magnetostrictive element subjected to a cycling load employing a partially submerged buoy. Preliminary first order calculations to validate the concept have been carried out. The results, illustrated in FIG. 3, show that for practical geometries it is possible to obtain voltages as high as 200 V. Also, the nature of the voltage wave-form from a single device results in a sinusoidal voltage output. This analysis utilized a very simple model that assumed that a magnetostrictive member, with a cross-section of 2 cm×2 cm and length 2 m, is subject to a sinusoidal load varying from ~490 to ~1145 N, loads that can be easily generated by partial submersion of a buoy of weight 50 kg and effective density of around 300 kg/m$^3$. This initial analysis shows that it is possible to generate an oscillating voltage with an amplitude as high as 100 V using a simple geometry for the magnetostrictive element. The geometries or numbers used in this calculation in no way limit the scope of the present invention and are only intended as an example.

Figure 4:
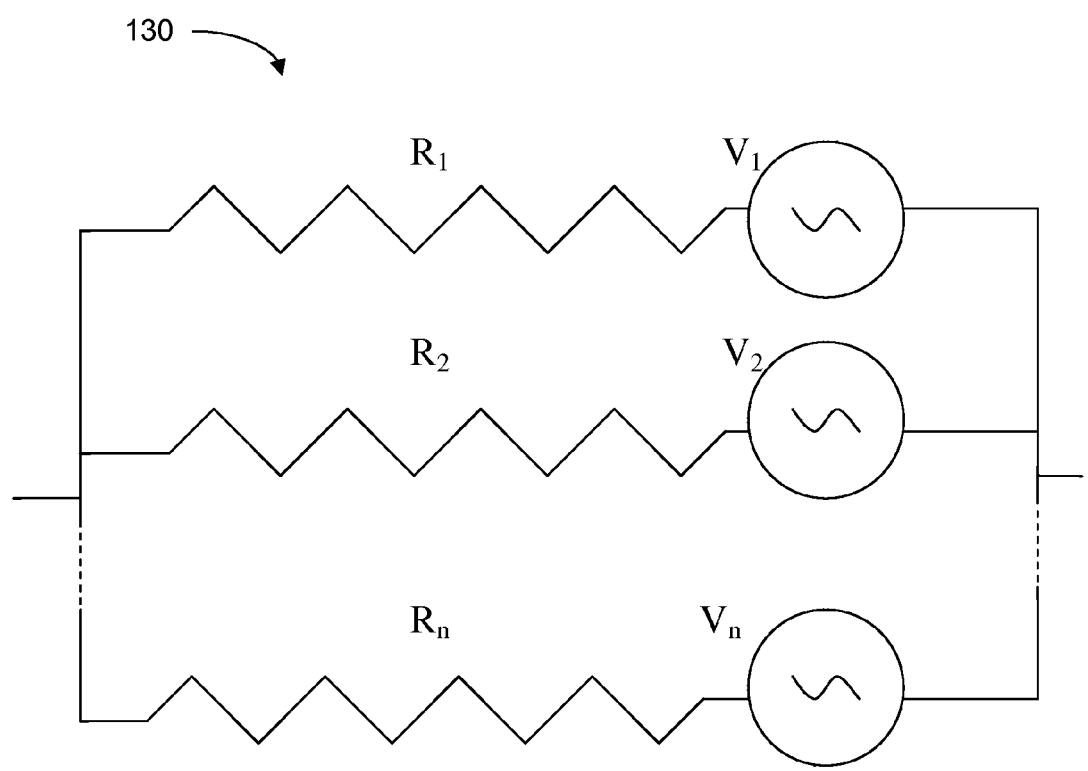

Since the frequency of the wave is determined by the frequency of the ocean waves and is therefore relatively low (i.e., under 1 Hz), the capacitance of the magnetostrictive elements may be ignored to develop an equivalent circuit diagram as shown in FIG. 4. In particular, FIG. 4 depicts a schematic circuit diagram 130 of one embodiment of an equivalent circuit diagram of several magnetostrictive elements arranges so as to move synchronously as an ocean wavefront moves through. By controlling the manufacturing process of the magnetostrictive elements, it is possible to the condition $R_1 \approx R_2 \approx \ldots \approx R_n$. If the magnetostrictive elements are arranged so that they all are synchronized to move in unison as the wave front moves along, a high power, high-voltage output can be generated. In one embodiment, the movement of the magnetostrictive elements may be synchronized by locating the elements in a pattern that anticipates the expected geometry of the waveforms in a particular geographic area.

FIG. 5 depicts another schematic block diagram of the energy harvesting device 100 of FIG. 1. As explained above, the illustrated energy harvesting device 100 includes a tether controller 140 with one or more pulleys 142 and/or sensors 144. Although the pulleys and sensors are shown as part of the anchors, other embodiments may include pulleys and/or sensors in different parts of the overall configurations, e.g., at the buoys, between the tethers and magnetostrictive elements, and so forth. The illustrated anchors also include batteries 146, which may store electrical energy generated by one or more of the energy harvesting devices. In some embodiments, multiple energy harvesting devices are coupled to a power management system 148, which combines the electrical energy generated at each of the energy harvesting devices into one or more outputs with higher voltages and/or overall power.

It should be noted that the technology described herein is clean and creates electricity from ocean waves without consuming any carbonaceous fuels or generating any harmful pollutants. Even compared with other technologies for harvesting ocean power, the lack of moving parts and joints that require lubrication that may leak and pollute the oceans, this technology is exceptionally clean and environmentally friendly. The substitution of the energy generated by embodiments described may herein reduce green house gases and pollutants, compared with fossil fuels, without any undesirable side-effects or compromises. Finally, the technology is friendly to marine life as the structures will not result in any significant impediment to natural migration patterns or affect sea-life in any significant way.

In the above description, specific details of various embodiments are provided. However, some embodiments may be practiced with less than all of these specific details. Although the operations of the method(s) herein are shown and/or described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner. Although specific embodiments of the invention have been described and illustrated, the invention is not to be limited to the specific forms or arrangements of parts so described and illustrated. The scope of the invention is to be defined by the claims appended hereto and their equivalents.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A device for producing electric power, the device comprising:
   at least one magnetostrictive element;
   an electrical conductor in a vicinity of the magnetostrictive element; and
   at least one buoy which, when deployed in a body of liquid subject to wave motion, is configured to remain partially submerged during normal wave motion;
   wherein the buoy is coupled to the magnetostrictive element to continuously exert a varying force on the magnetostrictive element during the normal wave motion to impose a change in stress of over 1 megapascal (MPa) on the magnetostrictive element.

2. The device of claim 1, wherein the stress in the magnetostrictive element resulting from the varying force varies over time in response to the normal wave motion.

3. The device of claim 1, wherein changes in the varying force on the magnetostrictive element result in flux changes in the magnetostrictive element, wherein the flux changes induce a current in the electrical conductor.

4. The device of claim 1, further comprising a battery coupled to the electrical conductor, wherein the battery is configured to store at least some of the electrical energy induced in the electrical conductor.

5. The device of claim 1, further comprising a power management system to control power generated by induction based on changes in the varying force exerted on a plurality of magnetostrictive elements.

6. The device of claim 1, wherein the magnetostrictive element is configured to exhibit a change in magnetization of an associated magnetic field in response to a corresponding change in the varying force exerted on the magnetostrictive element.

7. The device of claim 1, wherein the magnetostrictive element comprises a magnetostrictive rod.

8. The device of claim 1, further comprising an external protective sheath to substantially protect the magnetostrictive element from corrosive environmental conditions.

9. The device of claim 1, further comprising an anchor device below a surface of the body of water, wherein the magnetostrictive element is coupled to the anchor device between the anchor device and the buoy.

10. The device of claim 9, further comprising a rigid tether coupled to the magnetostrictive element between the anchor device and the buoy.

11. The device of claim 10, further comprising a tether controller to control a distance between the anchor device and the buoy, wherein the distance between the anchor device and the buoyant device correlates to strain on the magnetostrictive element.

12. The device of claim 11, wherein the tether controller comprises:
- a load sensor to monitor a tensile load on the magnetostrictive element; and
- a pulley to change a distance between the anchor device and the buoy according to a target force on the magnetostrictive element.

13. A device for generating electric power, the device comprising:
- a magnetostrictive element which, when deployed in a body of liquid subject to wave motion, is configured to experience a load change of over 1 megapascal (MPa) with an associated magnetic flux change in response to the wave motion; and
- an electromagnetic induction structure to produce electric power through electromagnetic induction in response to the magnetic flux change in the magnetostrictive element.

14. The device of claim 13, further comprising a buoy coupled to the magnetostrictive element, wherein the wave motion of the body of liquid causes the buoy to exert a force on the magnetostrictive element.

15. The device of claim 14, further comprising an anchor deployed at a substantially fixed location relative to the buoy, wherein the magnetostrictive element is mechanically coupled to both the buoy and the anchor.

16. The device of claim 14, wherein the buoy is further configured to remain partially submerged during normal wave motion of the body of liquid.

17. A method for generating electric power, the method comprising:
- exposing a magnetostrictive element to a force due to wave motion of a body of liquid, wherein the force results in a change in stress of over 1 megapascal (MPa) on the magnetostrictive element and a magnetic flux change in the magnetostrictive element; and
- producing electric power through electromagnetic induction based on the magnetic flux change in the magnetostrictive element.

18. The method of claim 17, further comprising using a buoy coupled to the magnetostrictive element to consistently maintain the force on the magnetostrictive element, wherein the force changes over time due to the wave motion of the body of liquid.

19. The method of claim 18, further comprising controlling a length of a tether coupled to the magnetostrictive element to maintain the buoy in a partially submerged state during normal wave operation.

20. The method of claim 17, further comprising transmitting the produced electric power to a battery for storage.

* * * * *